United States Patent
Kuo

(10) Patent No.: US 11,876,535 B1
(45) Date of Patent: Jan. 16, 2024

(54) MEMORY CONTROLLER AND METHOD FOR CONTROLLING DATA IN DECODING PIPELINE

(71) Applicant: Silicon Motion, Inc., Jhubei (TW)

(72) Inventor: Shiuan-Hao Kuo, New Taipei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 17/933,190

(22) Filed: Sep. 19, 2022

(30) Foreign Application Priority Data

Aug. 18, 2022 (TW) .................................. 111131087

(51) Int. Cl.
  *H03M 13/00* (2006.01)
  *H03M 13/11* (2006.01)
  *H03M 13/15* (2006.01)

(52) U.S. Cl.
  CPC .... *H03M 13/1111* (2013.01); *H03M 13/1128* (2013.01); *H03M 13/1575* (2013.01)

(58) Field of Classification Search
  CPC .......... H03M 13/1111; H03M 13/1128; H03M 13/1575; H03M 13/116
  See application file for complete search history.

(56) References Cited

U.S. PATENT DOCUMENTS

| | | | | |
|---|---|---|---|---|
| 8,984,365 B1* | 3/2015 | Norrie | ................ | H03M 13/1111 |
| | | | | 714/755 |
| 10,110,249 B2* | 10/2018 | Zhang | .................. | G06F 11/1068 |
| 10,116,333 B2* | 10/2018 | Zamir | ................ | H03M 13/1105 |
| 10,122,382 B2* | 11/2018 | Prabhakar | ........... | G06F 11/1012 |
| 10,374,630 B2* | 8/2019 | Kim | ..................... | G06F 11/1012 |
| 10,997,021 B2* | 5/2021 | Ha | ...................... | H03M 13/1108 |
| 11,005,499 B2* | 5/2021 | Kim | ................... | H03M 13/1131 |
| 11,139,832 B1* | 10/2021 | Kang | ................ | H03M 13/3753 |
| 11,316,532 B1* | 4/2022 | Hsu | ..................... | H03M 13/1145 |

* cited by examiner

*Primary Examiner* — Esaw T Abraham
(74) *Attorney, Agent, or Firm* — McClure, Qualey & Rodack, LLP

(57) ABSTRACT

A memory controller, for use in a data storage device, is provided. A low-density parity-check (LDPC) decoding procedure performed by the memory controller includes an initial phase, a decoding phase, and an output phase in sequence. The memory controller includes a memory-index control circuit and a decoder. The decoder includes a decoding pipeline to perform the decoding phase of the LDPC decoding procedure. After the data storage device is booted up, the decoder reads a plurality of first codewords from a variable-node memory using a first order via the memory-index control circuit for LDPC decoding. In response to the decoder determining that a specific codeword among the first codewords has decoding failure, the decoder is reset to read a plurality of second codewords from the variable-node memory using a second order via the memory-index control circuit for LDPC decoding. The first order is different from the second order.

14 Claims, 12 Drawing Sheets

$$H = \begin{bmatrix} \overset{V1}{1} & \overset{V2}{1} & \overset{V3}{0} & \overset{V4}{1} & \overset{V5}{0} & \overset{V6}{1} & \overset{V7}{0} \\ 0 & 1 & 1 & 0 & 1 & 0 & 1 \\ 1 & 1 & 1 & 1 & 0 & 1 & 0 \\ 0 & 0 & 0 & 0 & 1 & 1 & 1 \end{bmatrix} \begin{matrix} C1 \\ C2 \\ C3 \\ C4 \end{matrix}$$

MEMORY CONTROLLER AND METHOD FOR CONTROLLING DATA IN DECODING PIPELINE

CROSS REFERENCE TO RELATED APPLICATIONS

This Application claims priority of Taiwan Patent Application No. 111131087, file on Aug. 18, 2022, the entirety of which are incorporated by reference herein.

BACKGROUND OF THE INVENTION

Field of the Invention

The present invention relates to data accessing and, in particular, to a memory controller and a method for controlling data in a decoding pipeline.

Description of the Related Art

Low-density parity check (LDPC) decoders use a linear error correcting code with parity bits. Parity bits provide a decoder with parity equations which can validate a received codeword. For example, a low-density parity check is a fixed length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n−r. The codewords can be represented by a parity check matrix, which consists of r rows (representing equations) and n columns (representing digits). The codes are called low-density because the parity matrix will have very few '1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1A is a diagram of a parity-check matrix H. FIG. 1B is a diagram of a Tanner Graph. As depicted in FIG. 1A, each row in the parity-check matrix H may form a check node, such as check nodes C1, C2, C3, and C4. Each column in the parity-check matrix H may form a variable node, such as variable nodes V1, V2, V3, V4, V5, V6, and V7.

The Tanner graph is another way to represent codewords, and can be used to explain some of the operation of the low-density parity check (LDPC) decoder on hard-decision soft decoding when using a bit-flipping algorithm.

As depicted in FIG. 1B, in the Tanner graph, check nodes represented by the square nodes C1 to C4 is the number of parity bits, and the variable nodes represent by the circular nodes V1 to V7 is the number of bits in a codeword. If a particular equation is related to a code symbol, the corresponding check node and variable node are represented by a line. The estimated information is passed along these lines and combined in different ways on the nodes.

When the LDPC decoding is started, the variable node will send an estimate to the check nodes on all lines, where these lines contain the bits that are considered correct. Then, each check node will perform a new estimate for each variable node according to all other connected estimates, and return the new estimated information to the variable node.

The new estimation is based on: the parity check equation forces all variable nodes to a specific check node so that the sum is zero.

These variable nodes receive new estimation information and use a majority rule (i.e., a hard decision) to determine whether the value of the transmitted original bit is correct. If the value of the original bit is determined to be incorrect, the original bit will be flipped. The flipped bits are then returned to the check nodes, and the aforementioned steps are performed iteratively a predetermined number of times until the parity-check equation is satisfied (i.e., the value calculated by the check node matches the value received from the variable node), early termination can be enabled, which will cause the system to end the decoding process before the maximum iterations are reached.

The parity-check iterations are implemented by performing a syndrome check. A valid codeword will fit the equation $H \cdot C^T = S = 0$, where H denotes a parity check matrix; C denotes a hard-decision codeword; and S denotes a syndrome. When S is equal to zero, it indicates that the decoding process is complete and no further information is needed. Generally, hard decisions and syndrome checks are performed during iterations. A non-zero syndrome indicates the existence of odd parity, and a new decoding iteration is required.

The conventional bit-flipping LDPC decoder has a decoding pipeline to update the calculated syndrome to the variable-node memory for transposing and summing operations. However, the variable-node unit is prone to misjudgment due to the delay of the decoding pipeline, which often does not use the latest syndrome when executing the decision of the bit-flipping algorithm, and may cause the decoder to enter a trapping status, resulting in higher error floor of the decoder.

BRIEF SUMMARY OF THE INVENTION

Accordingly, a memory controller and a method for controlling data in a decoding pipeline are provided to solve the aforementioned problem.

In an exemplary embodiment, a memory controller, for use in a data storage device, is provided. A low-density parity-check (LDPC) decoding procedure performed by the memory controller includes an initial phase, a decoding phase, and an output phase in sequence. The memory controller includes a memory-index control circuit and a decoder. The memory-index control circuit controls data access of a variable-node memory. The decoder includes a decoding pipeline to perform the decoding phase of the LDPC decoding procedure. After the data storage device is booted up, the decoder reads a plurality of first codewords from the variable-node memory using a first order via the memory-index control circuit for LDPC decoding. In response to the decoder determining that a specific codeword among the first codewords has decoding failure, the decoder is reset to read a plurality of second codewords from the variable-node memory using a second order via the memory-index control circuit for LDPC decoding. The first order is different from the second order.

In some embodiments, the decoder comprises a check-node circuit and a variable-node circuit, and the decoding pipeline comprises a first stage, a second stage, a third stage, and a fourth stage in sequence, and the first stage indicates that a read operation of an input codeword required by a current clock cycle performed by the variable-node circuit to read the input codeword from the variable-node memory through the memory-index control circuit, and the second stage indicates a first calculation stage of one or more input codewords performed by the variable-node circuit, and the third stage indicates a second calculation stage of the one or more input codewords performed by the check-node circuit, and the fourth stage indicates that a write operation of a syndrome calculated by the check-node circuit in the current clock cycle performed by the check-node circuit to write the syndrome to the variable-node memory.

In some embodiments, the memory-index control circuit further provides LDPC parameters corresponding to the first order or the second order to the variable-node circuit and the check-node circuit of the decoder.

In some embodiments, in the decoding phase, during each LDPC iterative operation: the check-node circuit obtains a codeword difference from the variable-node circuit, and calculates the syndrome according to the codeword difference; and the variable-node circuit performs the following steps: determining a syndrome weight according to the syndrome from the check-node circuit; obtaining a previous codeword generated by a previous LDPC decoding iterative operation, and obtaining a channel value that was previously read from a flash memory without accessing a channel-value memory; determining a bit-flipping algorithm to flip one or more codeword bits in the previous codeword according to the syndrome weight to generate an updated codeword; and subtracting the previous codeword from the updated codeword to generate the codeword difference.

In some embodiments, the first order is an ascending order, and the second order indicates even numbers first and the odd numbers.

In some embodiments, in the initial phase, the variable-node circuit obtains the channel value that was read from the flash memory from the channel-value memory, and transmits the channel-value to the check-node circuit to calculate the syndrome In some embodiments, in the decoding phase, in response to the variable-node circuit determining that the syndrome is equal to 0 or a number of iterative operations has reached an upper limit, the variable-node circuit ends the decoding phase to enter the output phase.

In another exemplary embodiment, a method for controlling data in a decoding pipeline, for use in a data storage device, is provided. The data storage device comprises a memory controller and a flash memory, and a data-reading procedure of the flash memory comprises a low-density parity-check (LDPC) decoding procedure. The memory controller comprises a memory-index control circuit and a decoder, and the LDPC decoding procedure comprises an initial phase, a decoding phase, and an output phase. The method includes the following steps: after the data storage device is booted up, utilizing the decoder to read a plurality of first codewords from a variable-node memory using a first order via the memory-index control circuit for LDPC decoding; and in response to the decoder determining that a specific codeword among the first codewords has decoding failure, resetting the decoder to read a plurality of second codewords from the variable-node memory using a second order via the memory-index control circuit for LDPC decoding, wherein the first order is different from the second order.

In some embodiments, the decoder comprises a check-node circuit and a variable-node circuit, and the decoding pipeline comprises a first stage, a second stage, a third stage, and a fourth stage in sequence, and the first stage indicates that a read operation of an input codeword required by a current clock cycle performed by the variable-node circuit to read the input codeword from the variable-node memory through the memory-index control circuit, and the second stage indicates a first calculation stage of one or more input codewords performed by the variable-node circuit, and the third stage indicates a second calculation stage of the one or more input codewords performed by the check-node circuit, and the fourth stage indicates that a write operation of a syndrome calculated by the check-node circuit in the current clock cycle performed by the check-node circuit to write the syndrome to the variable-node memory.

In some embodiments, the memory-index control circuit further provides LDPC parameters corresponding to the first order or the second order to the variable-node circuit and the check-node circuit of the decoder.

In some embodiments, in the decoding phase, during each LDPC iterative operation, the method further includes the following steps: utilizing the check-node circuit to obtain a codeword difference from the variable-node circuit, and to calculate the syndrome according to the codeword difference; and utilizing the variable-node circuit to perform the following steps: determining a syndrome weight according to the syndrome from the check-node circuit; obtaining a previous codeword generated by a previous LDPC decoding iterative operation, and obtaining a channel value that was previously read from a flash memory without accessing a channel-value memory; determining a bit-flipping algorithm to flip one or more codeword bits in the previous codeword according to the syndrome weight to generate an updated codeword; and subtracting the previous codeword from the updated codeword to generate the codeword difference.

In some embodiments, the first order is an ascending order, and the second order indicates even numbers first and the odd numbers.

In some embodiments, in the initial phase, utilizing the variable-node circuit to obtain the channel value that was read from the flash memory from the channel-value memory, and to transmit the channel-value to the check-node circuit to calculate the syndrome.

In some embodiments, in the decoding phase, in response to the variable-node circuit determining that the syndrome is equal to 0 or a number of iterative operations has reached an upper limit, utilizing the variable-node circuit to end the decoding phase to enter the output phase.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 2:
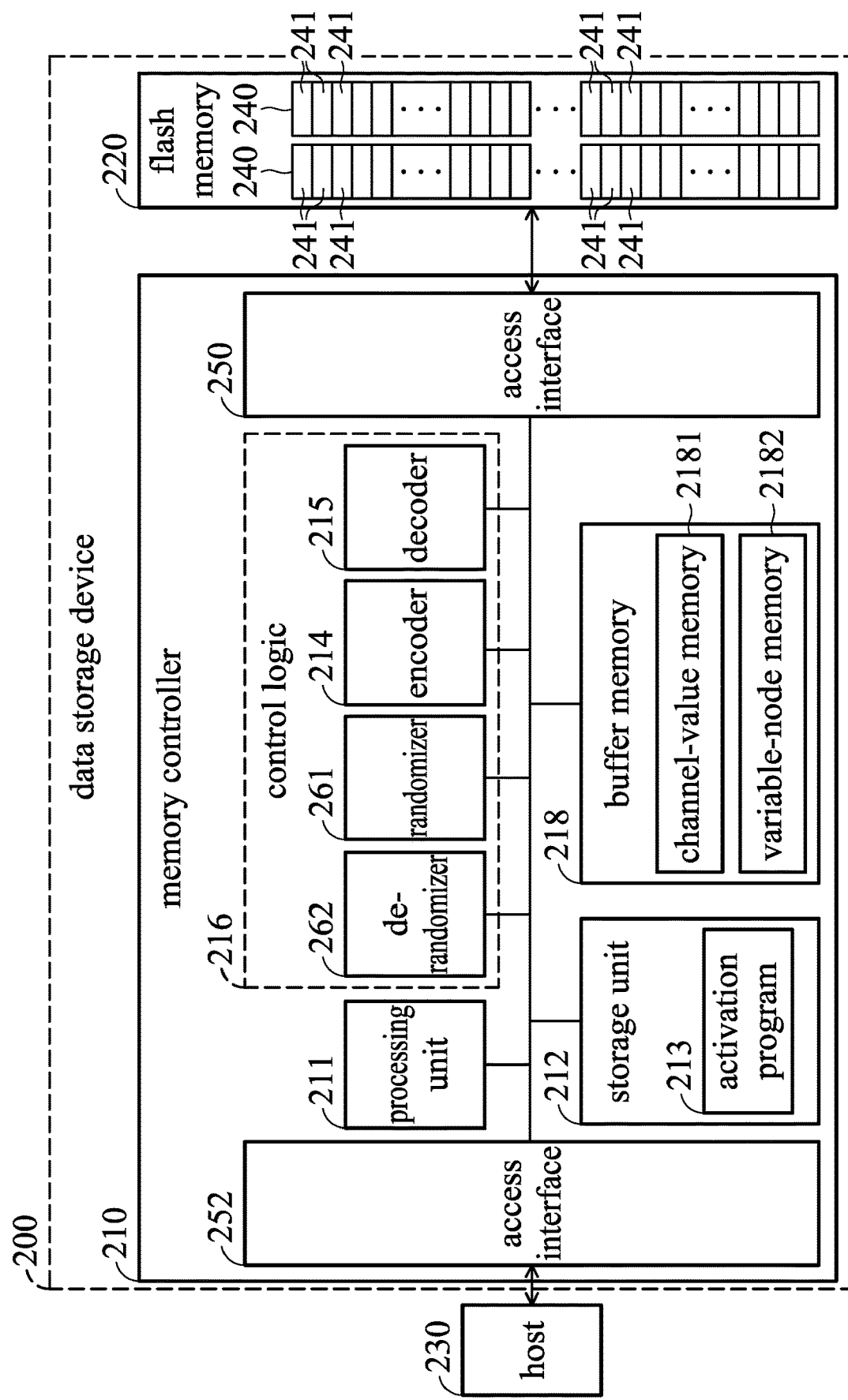
FIG. 2 is a block diagram of a data storage device in accordance with an embodiment of the invention.

FIG. 2 is a block diagram of a data storage device in accordance with an embodiment of the invention.

In an embodiment, the data storage device 200 may be a portable memory device (E.g., a memory card compatible with SD/MMC, CF, MS, XD standards) or a solid-state disk (SSD), and host 230 may be an electronic device, such as a mobile phone, a laptop computer, a desktop computer, etc., that is connected to the data storage device 200. In another embodiment, the data storage device 200 can be disposed in an electronic device such as a mobile phone, a laptop computer, or a desktop computer. At this time, the host device 230 may be a processor of the electronic device.

As depicted in FIG. 2, the data storage device 200 may include a memory controller 210 and a flash memory 220, wherein the memory controller 210 may be configured to access the flash memory 200. In an embodiment, the memory controller 210 may include a processing unit 211, a storage unit 212, a control logic 216, a buffer memory 218, and access interfaces 250 and 252. The processing unit 211 may be implemented by dedicated hardware circuits or general-purpose hardware, a processor with multiple processing cores, or a multi-processor with parallel processing capabilities, and the foregoing manner of implementation may, for example, be a general-purpose processor, or a microcontroller, but the invention is not limited thereto.

The storage unit 212 may be a non-volatile memory, such as a read-only memory (ROM), an erasable programmable read-only memory (EPROM), an electrically erasable programmable read-only memory (EEPROM), or an E-fuse. The storage unit 2121 stores an activation program that includes a boot code or a bootloader, and can be executed by the processing unit 211. The memory controller 210 completes the booting based on the activation program 213 and starts to control operations of the flash memory, such as reading an in-system programming (ISP) code.

The flash memory 220 may be a NAND flash memory, and may include a plurality of physical blocks 240, and each physical block may include a plurality of physical pages 241.

In the data storage device 200, several electrical signals are used for coordinating commands and data transfer between the processing unit 211 and the flash memory 220, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc.

The access interface 250 may communicate with the flash memory 220 using a SDR (Single Data Rate) protocol or a DDR (Double Data Rate) protocol, such as ONFI (open NAND flash interface), DDR toggle, or others. The processing unit 211 may communicate with the host 230 through an access interface 252 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

The buffer memory 218 may be a volatile memory such as a dynamic random access memory (DRAM) and/or a static random access memory (SRAM). In the embodiment, the buffer memory 218 may include a channel-value memory (CHVMem) 2181, and a variable-node memory (VNMem) 2182. The channel-value memory 2181 is configured to temporarily store the original page data (i.e., can be regarded as codewords) from the flash memory 220 via the access interface 250, or temporarily store the host commands from the host 230. The variable-node memory 2182 is configured to temporarily store the variable node data of each variable node in the decoding process for low-density parity checking. In addition, the codewords stored in the channel-value memory 2181 may be information read by the flash memory 220 in a hard or soft decision. A hard decision uses a single read voltage threshold, so the resulting codeword has only sign information. A soft decision uses multiple read voltage thresholds, so the obtained codeword also carries reliability information in addition to sign information. For example, each codeword bit can be expressed by the reliability information of at least one bit. If the reliability information is expressed as a single bit, 0 and 1 can be used to indicate two different reliability levels such as strong and weak. The codeword bit used together with the reliability information can be classified into four different levels of strong "1", weak "1", weak "0", and strong "0".

The control logic 216 may include an encoder 214 and a decoder 215. In some embodiments, the encoder 214, decoder 215, a randomizer 261, and a de-randomizer 262. In some embodiments, the encoder 214, decoder 215, randomizer 261, de-randomizer 262, and the control logic 216 are hardware circuits, and they can be implemented by application-specific integrated circuits (ASICs), field-programmable gate arrays (FPGAs), complex programmable logic device (CPLD), or logic circuits with the same function, but the invention is not limited thereto.

Figure 3:
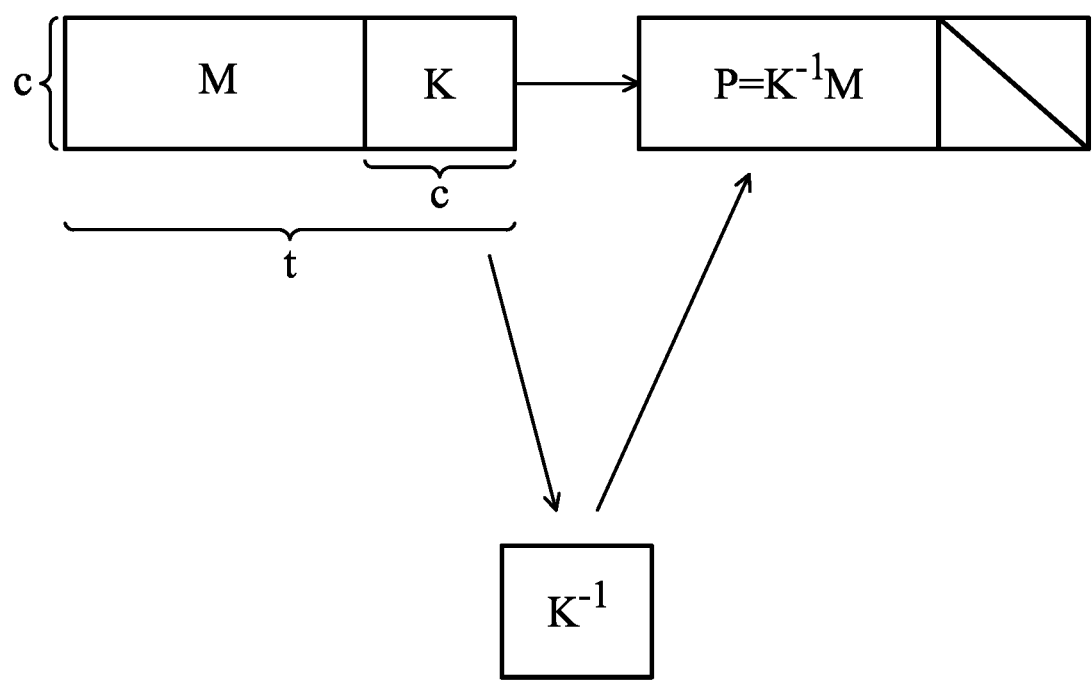
FIG. 3 is a diagram of a check-node check matrix and a check-code generation matrix.

In an embodiment, the randomizer 261 can be disposed in front of the encoder (i.e., the host-side) in the encoding procedure. For example, the data from the host 230 will first pass through the randomizer 261 to generate random data, where the ratio of the numbers of 0's and 1's in the random data is about 50%: 50%, and that is, 0's and 1's in the random data are substantially half, so as to improve the wear leveling of the flash memory 220. The encoder 214 may be an LDPC encoder that is configured to generate a corresponding check code according to the random data from the randomizer 261, and the generated check code conforms to a check-code check matrix. Specifically, referring to FIG. 3, it is assumed that the check-code check matrix is a matrix of size c*t (e.g., the number of rows c=5, and the number of columns t=48), and the check-code check matrix can be divided into a left-side matrix M of size c*(t−c) and a right-side matrix K of size c*c. In order to find the check-code generation matrix corresponding to the check-code check matrix, the inverse matrix $K^1$ of the matrix K can be found first, and the inverse matrix $K^1$ is the multiplied by the matrix M to obtain the matrix P. The transpose matrix of the matrix P can be used as the check-code generation matrix. In other words, after finding the transpose matrix of the matrix P, the encoder 214 can multiply the random data from the randomizer 261 by the transpose matrix of the matrix P to obtain the check code corresponding to the random data, and then the random data and the check code are multiplied by the check-code check matrix to determine whether the check code is correct. For example, if the multiplication result is equal to "0", it is determined that the encoding is correct. If the multiplication result is not equal to "0", it is determined that the encoding is incorrect. After the encoding is determined to be correct, the data and the corresponding check code will be written to one of the physical pages of the flash memory 220.

In the embodiment, the order of the decoder 215 and the de-randomizer 262 in the decoding process is relative to the order of the randomizer 261 and the encoder 214 in the encoding process. That is, the channel value read from the flash memory 220 will first pass through the decoder 215 and then pass through the de-randomizer 262. In some embodiments, the randomizer 261 and de-randomizer 262 can be regarded as a scrambler and a descrambler, respectively.

The decoder 215, for example, may be an LDPC decoder. When the host 230 sends a read command to the data storage device 230, the memory controller 210 obtains the initial page data from the flash memory 220, such as the channel value. In the embodiments, since the channel value read from the flash memory 220 has not been de-randomized by the de-randomizer 262, it indicates that the ratio of the numbers of 1's and 0's are substantially 50%:50%. For example, the channel value may include initial random data and error-correction code data. Because the initial random data and the error-correction code data may have errors when being transmitted through the channel, the decoder 215 may use the error-correction code data to perform error correction on the initial data and/or the error-correction code data, such as using a bit-flipping algorithm to perform LDPC decoding. Accordingly, the decoding result generated by the decoder 215 can be regarded as the correct random data that is input to the encoder 214, and the random data is de-randomized by the de-randomizer 262 to obtain original page data.

In another embodiment, the arrangement of the encoder 214 and randomizer 261 in the encoding process, and the decoder 215 and de-randomizer 262 in the decoding process is slightly different from that in the aforementioned embodiment. For example, the randomizer 215 and de-randomizer 216 can be disposed at the flash-memory side. In the encoding process, the data from the host 230 will first be encoded by the encoder 214 to generate a corresponding check code, and the data and its corresponding check code will pass through the randomizer 261 to generate random data that is written to the flash memory 220. In the decoding process, the channel value read from the flash memory 220 will first be de-randomized by the de-randomizer 262 to obtain the original data and its corresponding check code. Then, the decoder 215 performs LDPC decoding on the original and corresponding check code generated by the de-randomizer 262, thereby obtaining error-corrected data.

It should be noted that no matter whether the randomizer 261 and the de-randomizer 262 are disposed on the host side or the flash-memory side, the LDPC decoding method provided in the present invention can be used.

Figure 4:
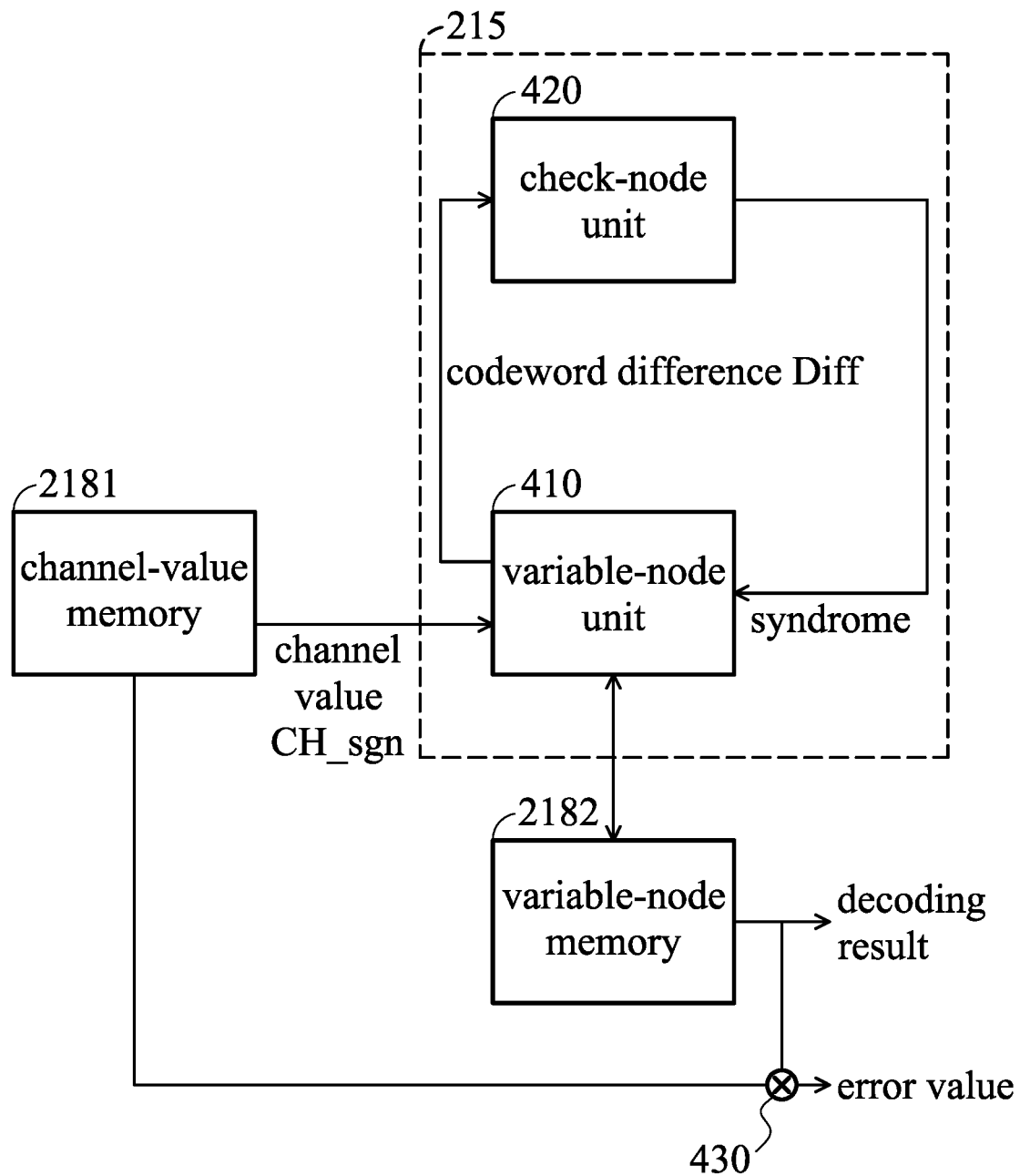
FIG. 4 is a block diagram of the decoder in accordance with an embodiment of the invention.

FIG. 4 is a block diagram of the decoder 215 in accordance with a first embodiment of the invention. As depicted in FIG. 4, the decoder 215 may include a variable-node unit (VNU) 410 and a check-node unit (CNU) 420. The data flow in the decoder 215 can be divided into three phases such as an initial phase, a decoding phase, and an output phase.

In the first embodiment, in the initial phase, the decoder 215 starts LDPC decoding, and the VNU 410 resets the previous codeword temporarily stored in the variable-node memory 2182. The initial phase can be regarded as the first iterative operation, and the VNU 410 may obtain a channel value CH_sgn from the channel-value memory 2181, and bypass the channel value CH_sgn to the CNU 420. For example, the channel value may be original page data read from the flash memory 220 using hard decision or soft decision.

Figures 1A, 1B:
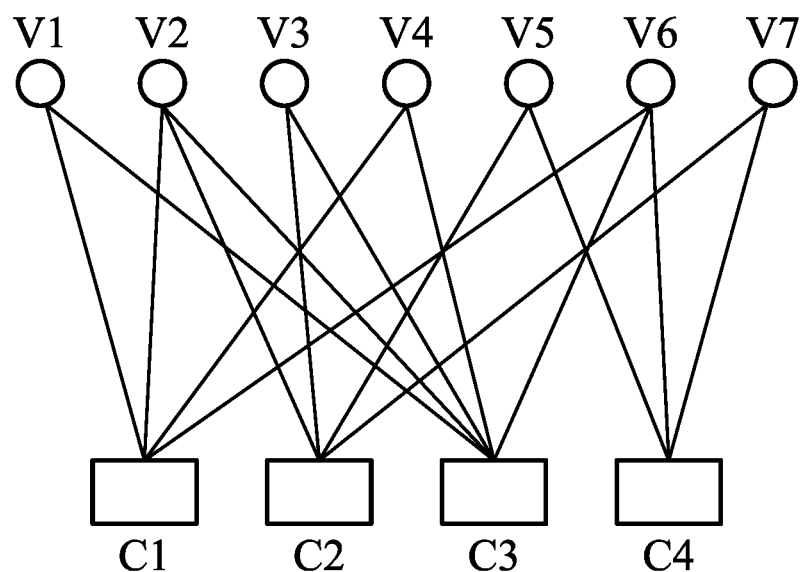
FIG. 1A is a diagram of a parity-check matrix.
FIG. 1B is a diagram of a Tanner graph.

The CNU 420 may calculate a syndrome of the first iterative operation using the initial channel value, that is, the CNU 420 may first calculate the check nodes C1 to C4 in the horizontal row shown in FIG. 1A. The CNU 420 may then transmit the calculated syndrome to the VNU 410. The VNU 410 may determine whether to perform calculations of subsequent variable nodes according to the syndrome from the CNU 420. If the syndrome is equal to 0, the VNU 410 may determine that the calculations of subsequent variable nodes are not necessary, and finish the initial phase to enter the output phase. If the syndrome is not equal to 0, the VNU 410 may calculate a syndrome weight according to the syndrome from the VNU 420 and the channel value CH_sgn, and perform a bit-flipping algorithm to determine whether one or more codeword bits in the channel value CH_sgn should be bit-flipped according to the calculated syndrome weight. The aforementioned bit-flipping algorithm can be implemented using techniques known in the field of the present invention, and thus its details are not described here.

Afterwards, the VNU 410 may store the updated codeword VN_new (which was generated by the bit-flipping on the channel value) in the variable-node memory 2182 for use by subsequent iterative operations. At this time, the initial phase of the LDPC decoding ends, and the decoding phase starts.

In the decoding phase, the VNU 410 and CNU 420 of the decoder 215 will continue to iterate until the syndrome generated by the CNU 420 is equal to 0 or an upper limit of iterative operations has been reached. For example, during each iterative operation, the VNU 410 will obtain the channel value CH_sgn and previous codeword VN_prev respectively from the channel-value memory 2181 and variable-node memory 2182, where the previous codeword VN_prev in the current iterative operation is the updated codeword VN_new generated in previous iterative operation and stored in the variable-node memory 2182. The VNU 410 may calculate a syndrome weight according to the syndrome from CNU 420 and the channel value CH_sgn, and perform a bit-flipping algorithm to determine whether one or more codeword bits in the channel value CH_sgn should be bit-flipped according to the calculated syndrome weight. Then, the VNU 410 may store the updated codeword VN_new (which was generated by bit-flipping the channel value) to the variable-node memory 2182 for subsequent iterative operations. The VNU 410 may calculate the difference value Diff between the updated codeword VN_new and previous codeword VN_prev, and transmit the difference value Diff to the CNU 420 for performing corresponding operations on the syndrome. When the syndrome generated by a specific iterative operation in the decoding phase is equal to 0 or the upper limit of iterative operations has been reached, the decoding phase ends and the output phase starts.

In the output phase, the decoder 215 may output the updated codeword VN_new stored in the VNU 410 as the decoding result. In addition, the updated codeword VN_new and the channel value are transmitted to an XOR gate 430 to obtain the difference between the decoding result and the channel value. For example, the difference between the decoding result and channel value can be used obtain the number of error bits in the channel value, and thus the number of error bits can be used to determine the current health status of the flash memory 220.

Figure 5:
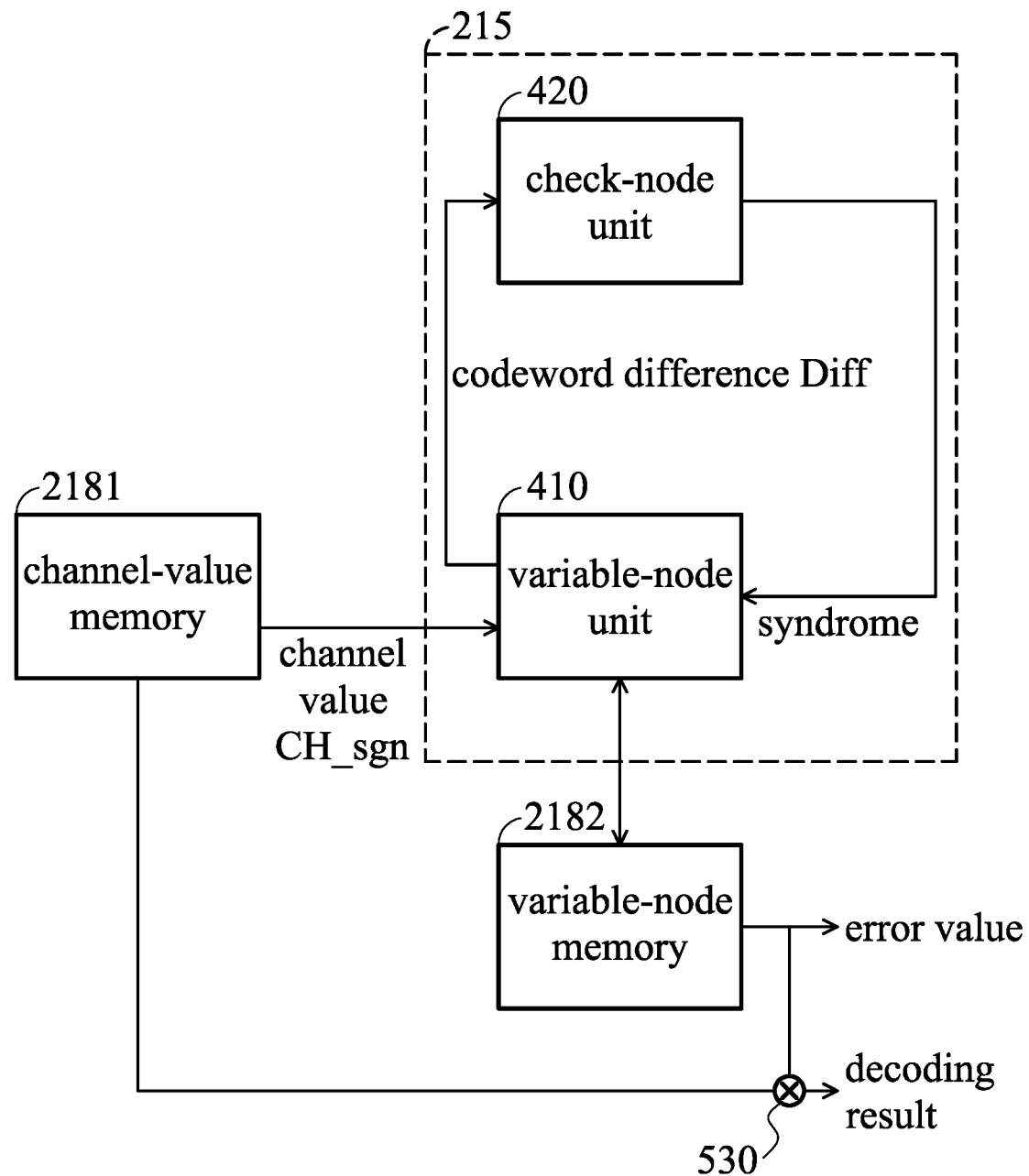
FIG. 5 is a block diagram of the variable-node unit in accordance with a first embodiment of the invention.

FIG. 5 is a block diagram of the decoder 215 in accordance with a second embodiment of the invention. In the second embodiment, the functions of the VNU 410 and CNU 420 in FIG. 5 are the same as those in FIG. 4, but the data-control flow in FIG. 5 is difference from that in FIG. 4.

For example, in the initial phase, the decoder 215 starts LDPC decoding, and the VNU 410 resets the previous codeword temporarily stored in the variable-node memory 2182. The initial phase can be regarded as the first iterative operation, and the VNU 410 may obtain a channel value CH_sgn from the channel-value memory 2181, and bypass the channel value CH_sgn to the CNU 420.

The CNU 420 may calculate a syndrome of the first iterative operation using the initial channel value, and transmit the calculated syndrome to the VNU 410. The VNU 410 may determine whether to perform calculations of subsequent variable nodes according to the syndrome from the CNU 420. If the syndrome is equal to 0, the VNU 410 may determine that the calculations of subsequent variable nodes are not necessary, and finish the initial phase to enter the output phase. If the syndrome is not equal to 0, the VNU 410 may directly set the updated codeword VN_new to 0 and write the updated codeword VN_new to the variable-node memory 2182, and finish the initial phase to enter the decoding phase.

In the decoding phase, the VNU 410 and CNU 420 of the decoder 215 will continue to iterate until the syndrome generated by the CNU 420 is equal to 0 or an upper limit of iterative operations has been reached. However, the difference between the embodiments of FIG. 5 and FIG. 4 is that, during each iterative operation in the decoding phase in FIG. 5, the VNU 410 may obtain the previous codeword VN_prev from the variable-node memory 2182 without obtaining the channel value CH_sgn from the channel-value memory 2181. Thus, the channel-value memory 2181 can be turned off to reduce power consumption in the decoding phase.

The VNU 410 may calculate a syndrome weight according to the syndrome from CNU 420, and perform a bit-flipping algorithm to determine whether one or more codeword bits in the channel value CH_sgn should be bit-flipped according to the calculated syndrome weight. Then, the VNU 410 may store the updated codeword VN_new (which was generated by bit-flipping the previous codeword VN_prev) to the variable-node memory 2182 for subsequent iterative operations. The VNU 410 may calculate the difference value Diff between the updated codeword VN_new and previous codeword VN_prev, and transmit the difference value Diff to the CNU 420 for performing corresponding operations on the syndrome. When the syndrome generated by a specific iterative operation in the decoding phase is equal to 0 or the upper limit of iterative operations has been reached, the decoding phase ends and the output phase starts.

In the output phase, the decoder 215 may output the updated codeword VN_new stored in the variable-node memory 2182 as a variable-node sign value VN_sgn, and add the variable-node sign value VN_sgn with the channel value CH_sgn to obtain the decoding result. Because the updated codeword VN_new stored in the variable-node memory 2182 is the result obtained from various iterations of the noise e, the variable-node sign value VN_sgn can be regarded as a difference value that can be used obtain the number of error bits in the channel value. Thus, the number of error bits can be used to determine the current health status of the flash memory 220.

Specifically, in the decoding phase in the embodiment of FIG. 5, the VNU 410, for example, performs operations on the codeword difference, but the in the end, the same decoding result as the decoding process in FIG. 4 can still be obtained. The aforementioned phenomenon can be deduced from the mathematical formula of the LDPC algorithm.

For example, since the LDPC algorithm uses linear block codes, the result of adding two different codewords can obtain another codeword. Accordingly, the channel value y read from the flash memory 220 can be regarded as the result of adding the correct codeword c and the noise e, and the calculation can be expressed by formula (1):

$$y = c \oplus e \tag{1}$$

The syndrome S can be obtained using the inner product of the parity-check matrix and the channel value y, where the calculation can be expressed by formula (2):

$$H \cdot y^T = S^T \tag{2}$$

Substituting formula (1) into formula (2), formula (3) can be obtained as follows:

$$H \cdot (c^T \oplus e^T) = S^T \tag{3}$$

After expanding formula (3), formula (4) can be obtained as follows:

$$H \cdot c^T + H \cdot e^T = S^T \tag{4}$$

If the correct codeword is set to 0, the inner product of the parity-check matrix H and the correct codeword c must be 0, and thus formula (4) can be rewritten as formula (5):

$$H \cdot e^T = S^T \tag{5}$$

That is, when the correct codeword is set to 0, the syndrome S obtained by each iterative operation of LDPC decoding is only related to the noise e, where the noise e can be regarded as error-codeword bits.

For example, setting the correct codeword c in formula (4) to 0 may correspond to the initial stage in the embodiment of FIG. 5, and the VNU may directly set the updated codeword VN_new to 0 and write the updated codeword VN_new to the variable-node memory 2182. It should be noted that since the data written to the flash memory 220 is the encoded random data that is obtained by first processing the data from the host by the randomizer 261 and then encoded by the encoder 214. Thus, in the decoding process, the codeword obtained by the decoder 215 can be regarded as high-density and high-weight data with substantially 50% of 1's and 50% of O's.

In the decoding phase in the embodiment of FIG. 4, the content accessed from the variable-node memory 2182 may include codewords with substantially 50% of 1's and 50% of 0's, and thus the toggle rate on the data lines of the variable-node memory 2182 is also very high, for example, it can be considered as 50%.

When the data-control flow in the embodiment of FIG. 5 is used, the content accessed from the variable-node memory 2182 may be error patterns. Since the raw-bit error rate (RBER) of a normal flash memory 220 is less than about 1%, the proportion of is in the error pattern is also less than about 1%. Accordingly, the toggle rate of the variable-node memory 2182 in FIG. 5 can be reduced to less than 1% from 50% in the embodiment of FIG. 4, thereby significantly reducing the power consumption of the decoder 214. In addition, the channel-value memory 2181 is not accessed during the decoding stage in the embodiment of FIG. 5, so the toggle rate on the data lines of the channel-value memory 2181 is 0, thereby further reducing the power consumption of the decoder 214.

The calculation process of formula (5) may correspond to the decoding stage in the embodiment of FIG. 5. That is, the noise e is calculated in each iterative operation of LDPC decoding. When the decoding phase ends, the codeword result (e.g., variable-node sign value VN_sgn) stored in the variable-node memory 2182 is the error value. The variable-node sign value VN_sgn and the channel value CH_sgn pass through the XOR gate 530 to obtain the decoding result.

Figure 6A:
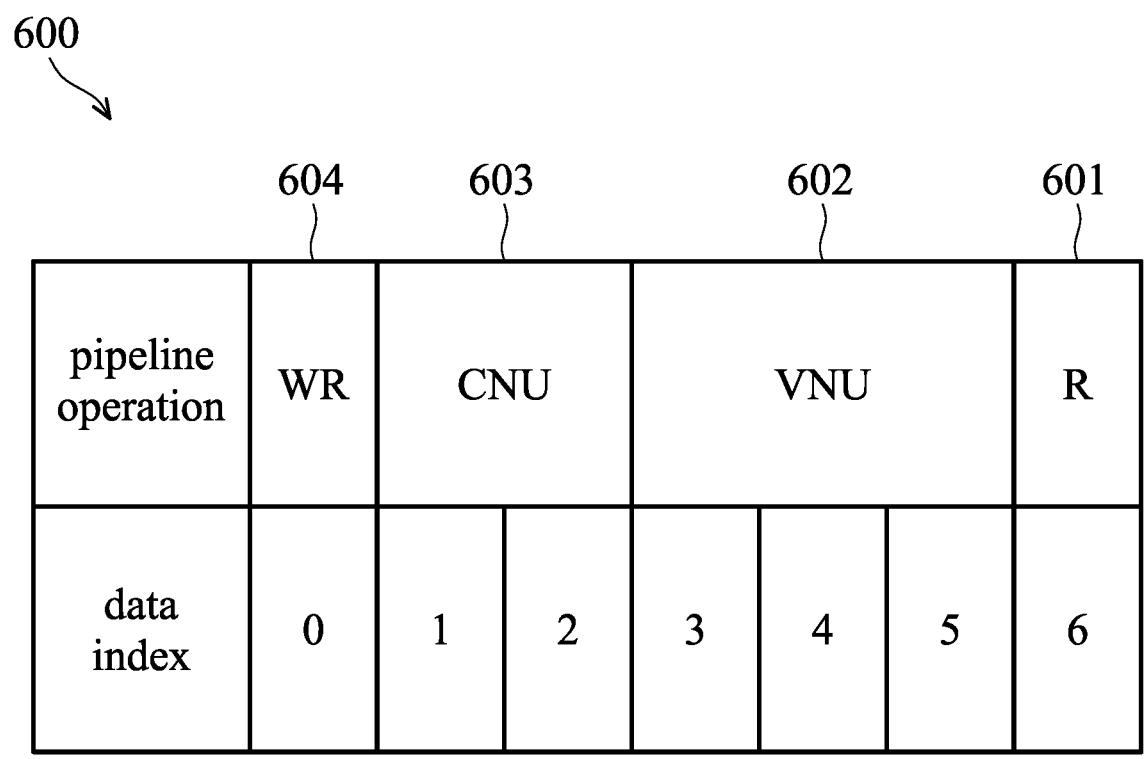
FIG. 6A is a diagram showing different decoding operations of the decoding pipeline in accordance with the second embodiment of the invention.
Figure 6B:
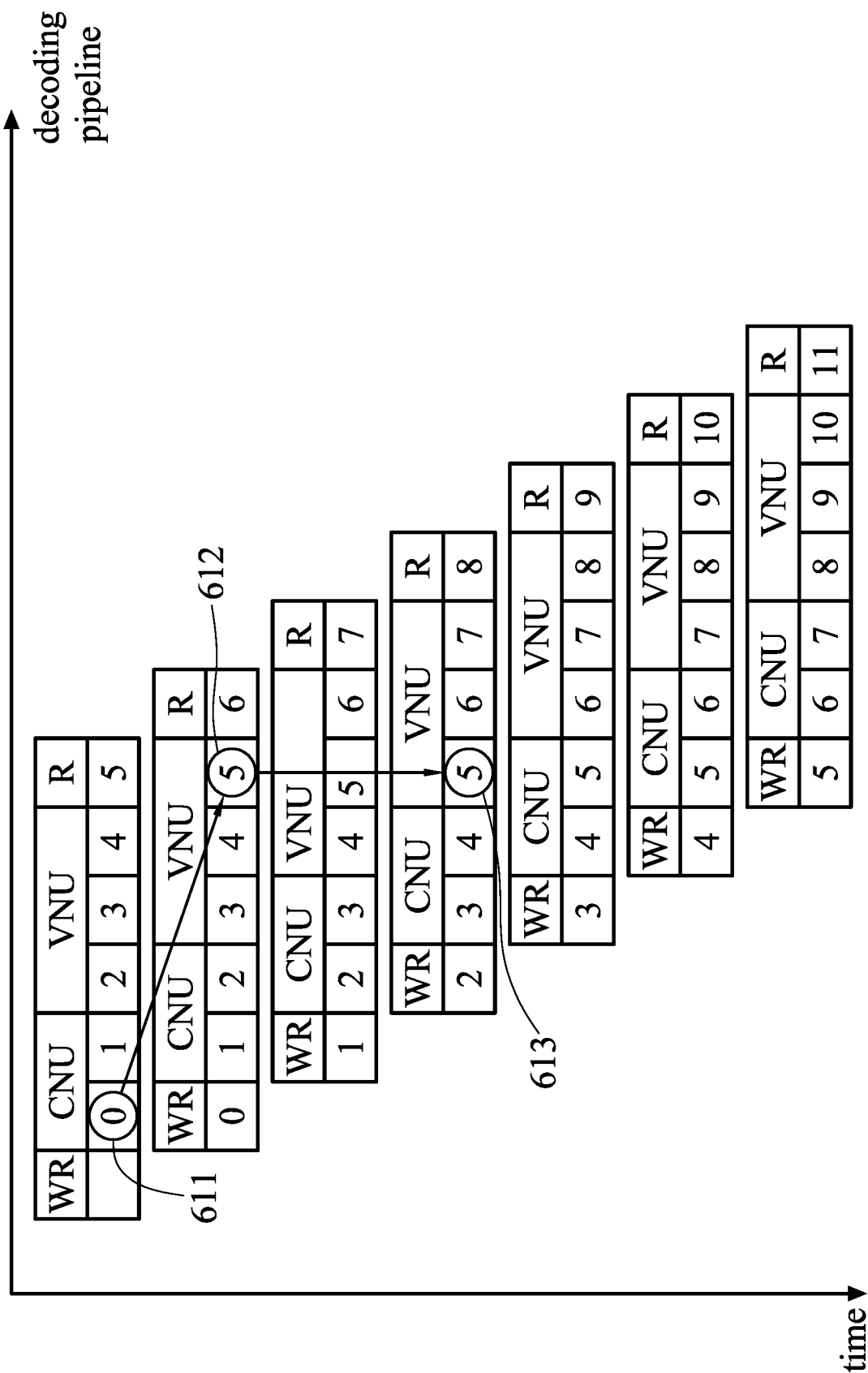
FIG. 6B is a diagram showing variations of data processed by the decoding pipeline over time in accordance with the second embodiment of the invention.

FIG. 6A is a diagram showing different decoding operations of the decoding pipeline in accordance with the second embodiment of the invention. FIG. 6B is a diagram showing variations of data processed by the decoding pipeline over time in accordance with the second embodiment of the invention. Please refer to FIG. 5 and FIGS. 6A-6B.

In an embodiment, as shown in FIG. 6A, the LDPC decoding procedure of the decoding pipeline 600 may include stages 601 to 604, wherein stage 601 indicates the read operation R to the variable-node memory 2182, and stage 602 indicates the calculation stage of the VNU 410, and stage 603 indicates the calculation stage of the CNU 420, and stage 604 indicates the write operation to the variable-node memory 2182. In addition, the fields in the data indices may indicate the stage number corresponding to the data having the index. In FIG. 6A, data DATA6 is in stage 601, and data DATA3~DATA5 is in stage 602, and data DATA1 and DATA2 is in stage 603, and data DATA0 is in stage 604.

It should be noted that in the embodiments of FIGS. 6A-6B, it is assumed that the execution time of the read operation in stage 603 and the write operation in stage 604 is one clock cycle, and the execution time of the calculation stage of the VNU 410 in stage 602 is 3 clock cycles, and the execution time of the calculation stage of the CNU 420 in stage 603 is 2 clock cycles, but the invention is not limited thereto. One having ordinary skill in the art can adjust the execution time in each stage according to requirements of hardware design of the decoding pipeline.

The LDPC decoding procedure of the decoding pipeline 600 starts from stage 601, and the data sequentially enters the decoding pipeline 600 in its index order. For example, in stage 601, data DATA0 (e.g., a codeword) is read from the variable-node memory 2182 in stage 601 in the first clock cycle. In stage 601, data DATA1, DATA2, and DATA3 is read from the variable-node memory 2182 in the second clock cycle to the fourth clock cycle, and the data DATA0, DATA1, and DATA2 are sequentially calculated in the VNU 410 in stage 602. In stage 601, the data DATA4 and DATA5 is read from the variable node memory 2182 in the fifth clock cycle and the sixth clock cycle, and the data DATA3 and DATA4 is decoded by the VNU 410 in stage 602, and data DATA0 and DATA1 is calculated by the CNU 420 in stage 603.

For example, after the CNU 420 has calculation of two clock cycles, the syndrome associated with the data (e.g., codeword) can be obtained. In the seventh clock cycle, data DATA6 is read from the variable-node memory 2182 in stage 601, and data DATA3, DATA4, DATA5 is sequentially calculated by the VNU 410 in stage 602, and data DATA1 and DATA2 is sequentially calculated by the CNU 420 in stage 603. Meanwhile, because the CNU 420 has calculated the syndrome associated with data DATA0, stage 604 can be entered to execute the write operation WR to write the syndrome associated the data DAT0 to the variable-node memory 2182.

Please refer to FIG. 6B, data in each stage of the decoding pipeline 600 changes over time, wherein the example in FIG. 6B is described when the decoding pipeline 600 starts from the sixth clock cycle. That is, in stage 601, data DATA5 is read from the variable-node memory 2182, and data DATA2~DATA4 is sequentially decoded by the VNU 410 in stage 602, and data DATA0 and DATA1 is sequentially calculated by the CNU 420 in stage 603. It should be noted that, in the sixth clock cycle, because the CNU 420 has not completed the check operation of any data, there is no need to write any data to the variable-node memory 2182 in stage 604.

In the next clock cycle (i.e., the seventh clock cycle), the CNU 420 has calculated the syndrome (e.g., area 611) associated with the data DATA0, and the write operation in stage 604 is performed to update the syndrome to the variable-node memory 2182 for transposing and summing calculations. Meanwhile, data DATA5 also enters stage 602 to perform corresponding calculations (e.g., area 612) by the VNU 410. When the VNU 410 is to perform bit flipping on data DATA5 (e.g., area 613), the syndrome used by the VNU 410 is already the syndrome in several clocks (e.g., corresponding to data DATA0) but not the syndrome corresponding to data DATA5. This situation of delay can be regarded as the pipeline delay. In addition, the length of the pipeline window in FIGS. 6A and 6B may vary depending on the actual hardware design. However, if the VNU 410 performs bit flipping within the pipeline window, the VNU 410 will not obtain the corresponding syndrome due to the design of the decoding pipeline.

Figure 7B:
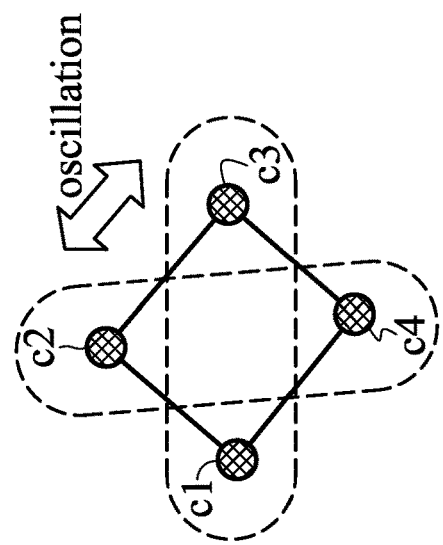
FIG. 7B is a diagram showing oscillation between codeword bits in accordance with the embodiment of FIG. 7A.
Figure 7A:
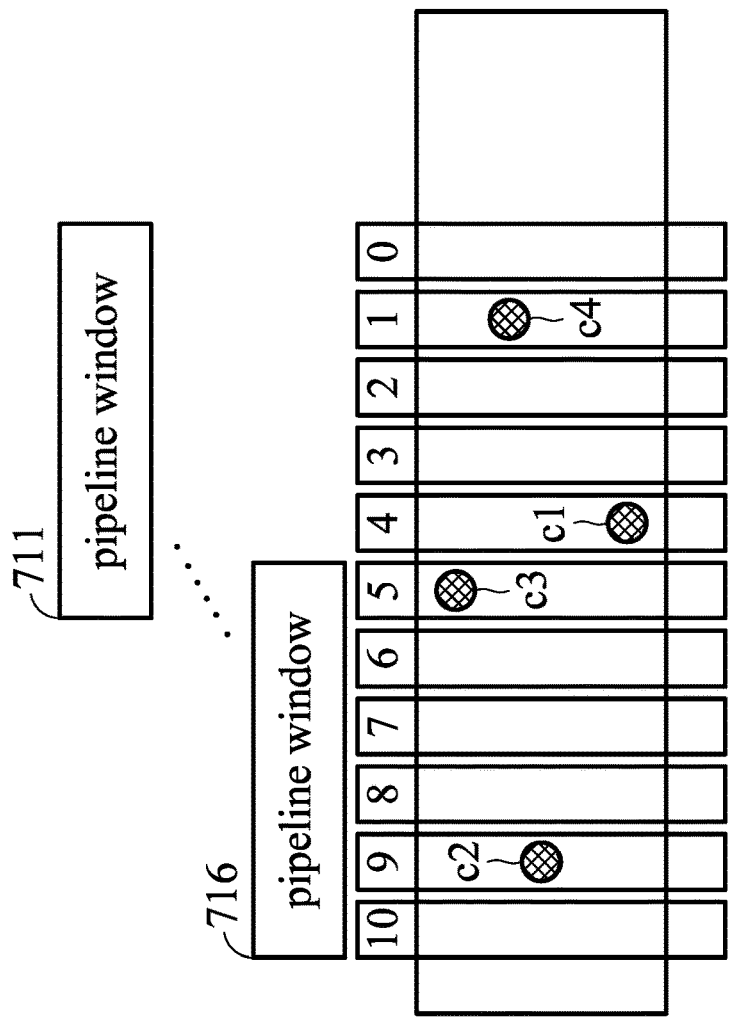
FIG. 7A is diagram showing the pipeline window, data, and the flipped codeword bits in the decoding pipeline in accordance with the second embodiment of the invention.

FIG. 7A is diagram showing the pipeline window, data, and the flipped codeword bits in the decoding pipeline in accordance with the second embodiment of the invention. FIG. 7B is a diagram showing oscillation between codeword bits in accordance with the embodiment of FIG. 7A. Please refer to FIG. 5, and FIGS. 7A-7B.

As shown in FIG. 7A, numbers 0 to 9 refer to the respective data indices of data DATA0 to DATA9, and the length of the pipeline windows 711 to 716 of the decoding pipeline of the decoder 215 is 6, and c1~c4 denote the flipped codeword bits. For example, in the first clock cycle, the pipeline window 711 may include data DATA0~DATA5, and so on. In the sixth clock cycle, the pipeline window 716 may include data DATA5~DATA10.

In some situations, small cycles within part of the pipeline windows may not be able to update data in time due to the pipeline delay, resulting in oscillation between two sets of error bits. For example, in the pipeline window 711, after the codeword c4 in data DATA1 is bit flipped, the VNU 410 cannot obtain the updated syndrome corresponding to data DATA1 from the calculation of data DATA4 and DATA5. It will cause erroneous determination of bit flipping on data DATA4 and DATA5. Similarly, in the pipeline window 716, the VNU 410 can obtain the updated syndrome corresponding to the data DATA1 from the calculation of data DATA9, however, due to the pipeline delay, the VNU 410 cannot get the updated syndrome corresponding to the data DATA4 and DATA5 from the calculation of data DATA9. It will cause erroneous determination of bit flipping on data DATA9. When the aforementioned situation occurs, there may be oscillation occurred between the codeword bit c4 of data DATA1, codeword bit c1 of data DATA4, codeword c3 of data DATA5, and codeword bit c2 of data DATA9, as shown in FIG. 7B. This situation can be regarded as the trapping set caused by the pipeline delay, and it will cause the decoding pipeline of the decoder 215 to enter the trapping status.

Figure 8:
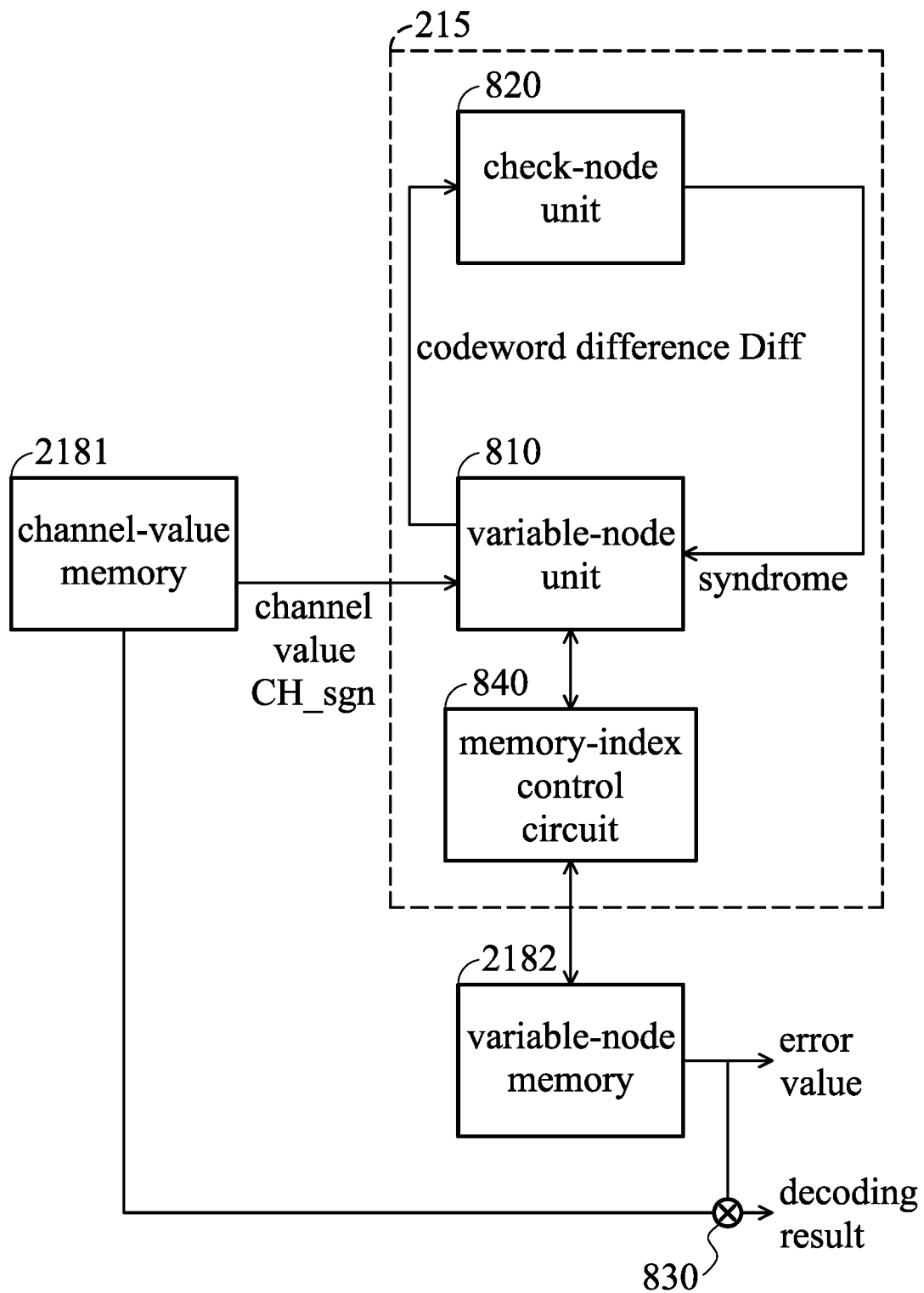
FIG. 8 is a block diagram of the decoder 215 in accordance with the third embodiment of the invention.
Figure 9:
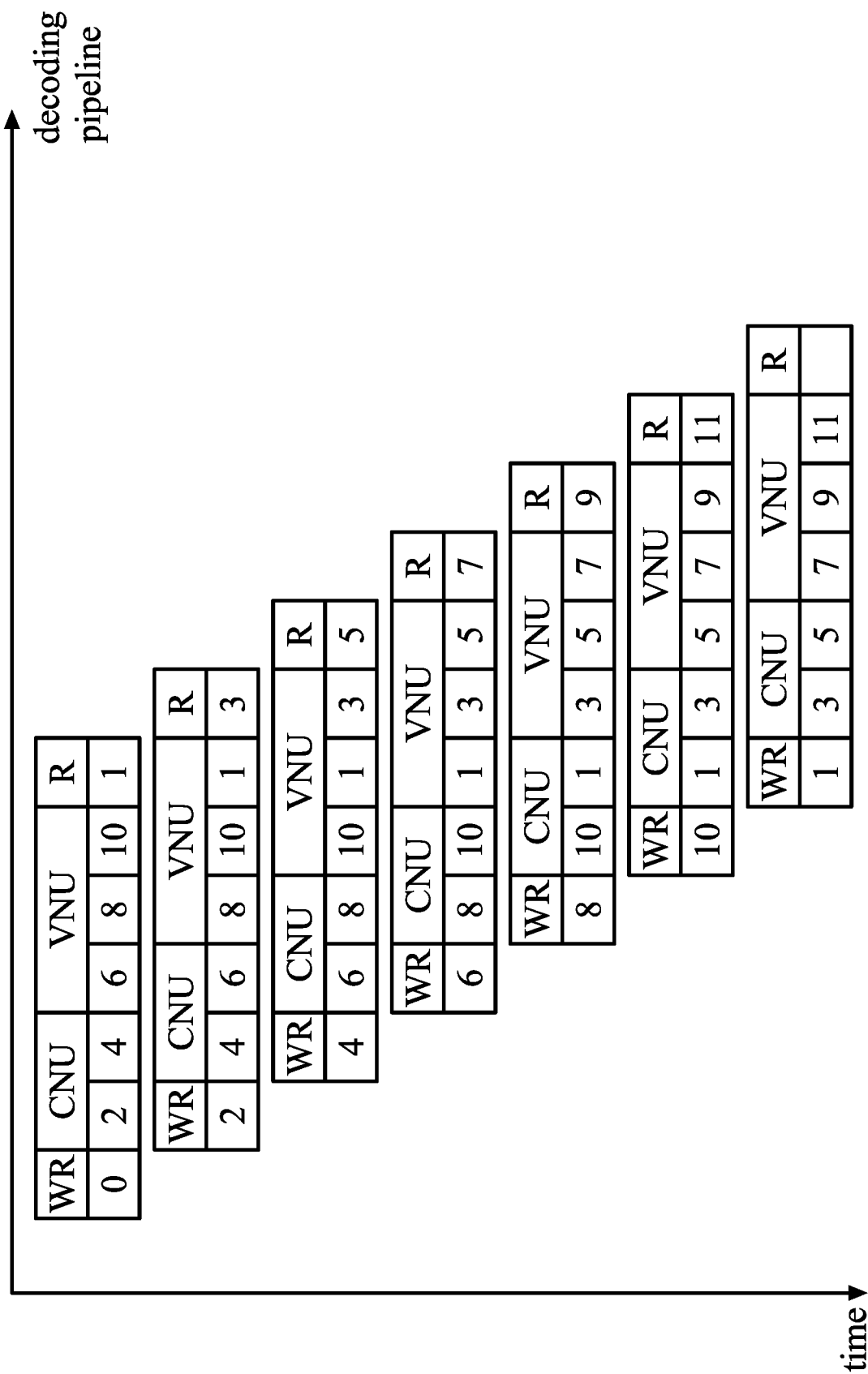
FIG. 9 is a diagram showing the data processed by the decoding pipeline over time in accordance with the third embodiment of the invention.

FIG. 8 is a block diagram of the decoder 215 in accordance with the third embodiment of the invention. FIG. 9 is a diagram showing the data processed by the decoding pipeline over time in accordance with the third embodiment of the invention. Please refer to FIG. 5, FIG. 8, and FIG. 9.

As shown in FIG. 8, the decoder 215 may include a variable-node unit 810, a check-node unit 820, and a memory-index control circuit 840. The functions of the VNU 810 and CNU 820 in FIG. 8 are similar to the VNU 410 and CNU 420 in FIG. 5, and thus the details will not be repeated here.

The memory-index control circuit 840 is used to control order of the data index of the data provided to the VNU 810, and to provide correct LDPC parameters corresponding to the data-index order used by the VNU 810. For example, the memory-index control circuit 840 may include a plurality of data-index orders, such as order 1 to order N, where the plurality of data-index orders may include a predetermined data-index order.

In an embodiment, order 1, for example, may be ascending order, that is, the data-index order provided to the VNU 810 is 0, 1, 2, 3, and so on. Order 2 can be that the data index is an event number first and then an odd number, which means that the data-index order provided to the VNU 810 is 0, 2, 4, 6, ..., 1, 3, 5, 7 ..., and so on. Order 3 can be that the data index is an odd number first and then an even number, which means that the data-index order provided to the VNU 810 is 1, 3, 5, 7, ..., 0, 2, 4, 6, and so on. It should be noted that the data-index order used by the memory-index control circuit 840 is not limited to the aforementioned orders, and one having ordinary skill in the art can design the required data-index order according to practical needs.

For example, if the memory-index control circuit 840 selects order 2 (e.g., 0, 2, 4, 6, 8, 10, 1, 3, 5, 7, 9, 11) as the data-index order of the data provided to the VNU 810, the data processed by the decoding pipeline of the decoder 215 is shown in FIG. 9.

In addition, in some embodiments, order 1 can be used as the default data-index order of the decoder 215. After the data storage device 200 is booted up, the memory-index control circuit 840 of the decoder 215 will perform LDPC decoding using order 1. When the decoder determines that the decoding of the current codeword fails (e.g., an uncorrectable error occurs) or the number of codewords having decoding failure has reached a predetermined number, the decoder 215 can be restarted to perform LDPC decoding using other data-index order (e.g., order 2, order 3, or other data-index order).

Figure 10:
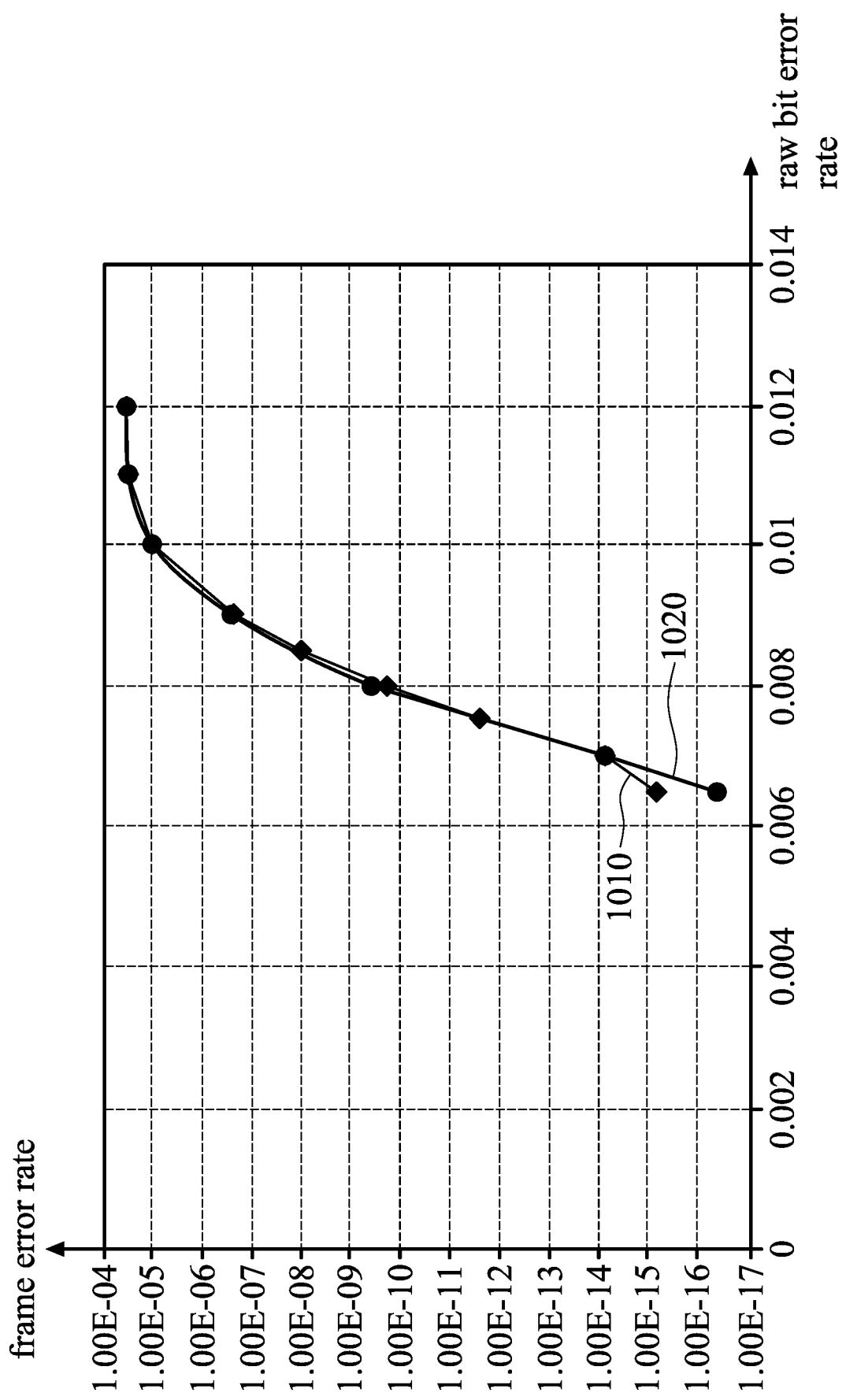
FIG. 10 is a diagram showing the relationship curve between the frame error rate and the raw bit error rate of the decoder in accordance with different embodiments of the invention.

FIG. 10 is a diagram showing the relationship curve between the frame error rate and the raw bit error rate of the decoder in accordance with different embodiments of the invention. Please refer to FIG. 5, FIG. 8, and FIG. 10.

As shown in FIG. 10, curve 1010 may indicate the relationship curve between the frame error rate (FER) and the raw bit error rate (RBER) of LDPC decoding performed by the decoder 215 in the embodiment of FIG. 5. Curve 1020 may indicate the relationship curve between the frame error rate (FER) and the raw bit error rate (RBER) of LDPC decoding performed by the decoder 215 in the embodiment of FIG. 8.

Specifically, the decoder 215 in the embodiment of FIG. 5 uses a fixed data-index order (e.g., ascending order) for LDPC decoding. When decoding failure occurs, the decoder 215 in the embodiment of FIG. 5 can still only use the same data-index order. Thus, for similar codewords having decoding failure, there is still a higher probability for the decoder 215 to enter the trapping status or to cause oscillation between two sets of error codeword bits due to the pipeline delay. The decoder 215 in the embodiment of FIG. 8 may include a plurality of data-index orders (e.g., orders 1 to 3 in the embodiment of FIG. 8). When decoding failure occurs, the decoder 215 in the embodiment of FIG. 8 can be reset to use a different data-index order. Thus, for similar codewords that failed in previous decoding, the probability of causing the decoder 215 to enter the trapping status or to oscillate between two set of error codeword bits due to the pipeline delay can be significantly reduced. The aforementioned difference can be seen from FIG. 10. For example, when the RBER is about 0.0065, the FER of curve 1020 which corresponds to the decoder 215 in FIG. 8 is much lower than the FER of curve 1010. Accordingly, in comparison with the decoder 215 in FIG. 8, the error rate of the decoder 215 in FIG. 8 is significantly reduced, and its error correction capability can be greatly increased.

Figure 11:
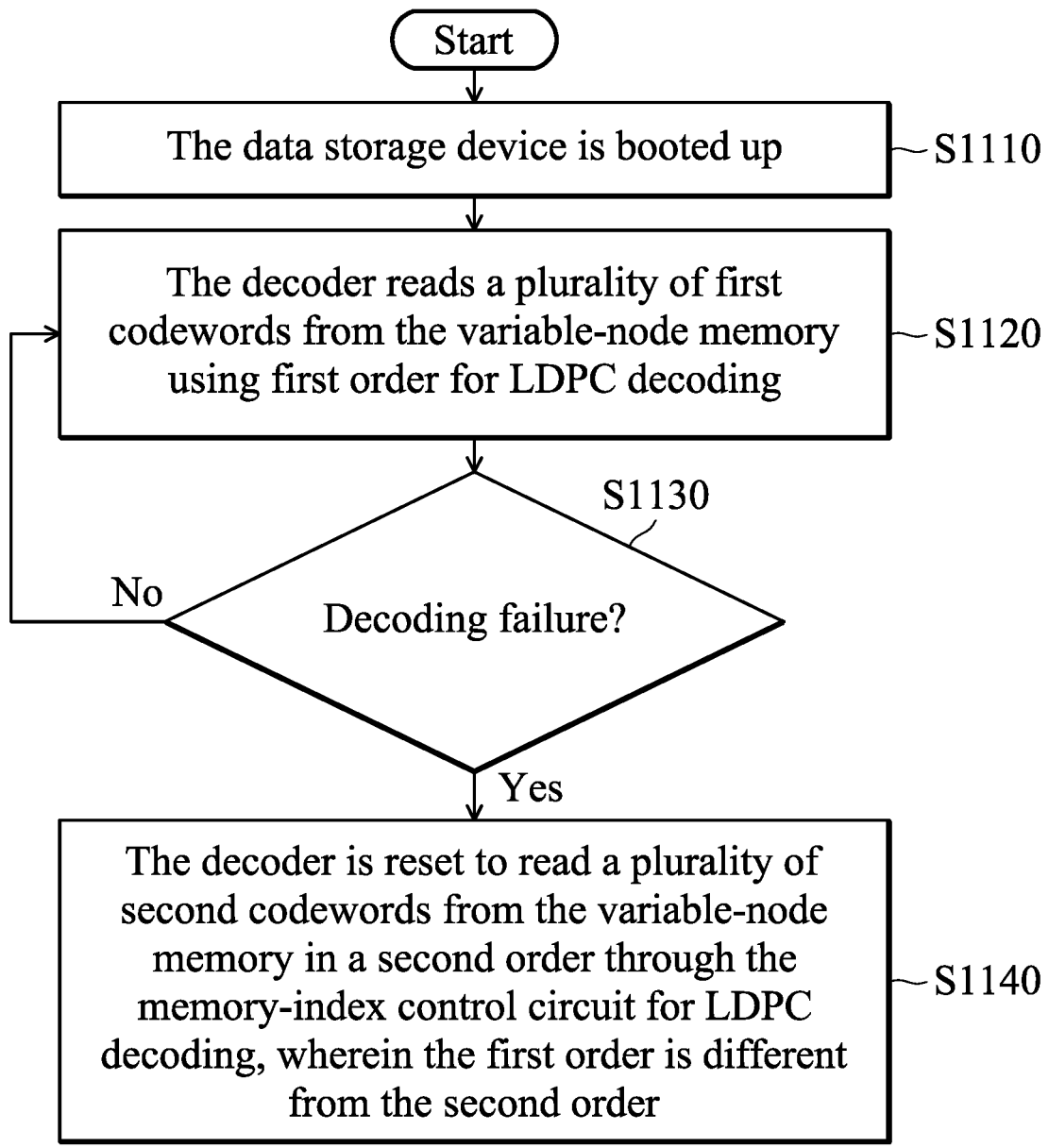
FIG. 11 is a flow chart of a method for controlling data in a decoding pipeline in accordance with an embodiment of the invention.

FIG. 11 is a flow chart of a method for controlling data in a decoding pipeline in accordance with an embodiment of the invention. Please refer to FIG. 2, FIG. 8, and FIG. 11.

In step S1110, the data storage device 200 is booted up.

In step S1120, the decoder 215 reads a plurality of first codewords from the variable-node memory 2182 using first order for LDPC decoding.

In step S1130, the decoder 215 determines whether decoding of a specific codeword among the first codewords fails. If the decoding of the specific codeword fails, step S1140 is performed. If none of the first codewords fails to decode, the flow goes back to step S1120 to perform LDPC decoding on the first codewords using the first order. For example, when the decoder 215 determines that decoding of the current codeword fails (e.g., an uncorrectable error occurs) or the number of codewords having decoding failure has reached a predetermined number, the decoder 215 can be restarted to perform LDPC decoding using other data-index order (e.g., order 2, order 3, or other data-index order).

In step S1140, the decoder 215 is reset to read a plurality of second codewords from the variable-node memory 2182 in a second order through the memory-index control circuit 840 for LDPC decoding, wherein the first order is different from the second order. In some embodiments, order 1, for example, may be ascending order, that is, the data-index order provided to the VNU 810 is 0, 1, 2, 3, and so on. Order 2 can be that the data index is an event number first and then an odd number, which means that the data-index order provided to the VNU 810 is 0, 2, 4, 6, . . . , 1, 3, 5, 7 . . . , and so on.

In view of the above, a memory controller and a method for controlling data in the decoding pipeline are provided, which are capable of resetting the decoder to use a different data-index order for LDPC decoding when decoding failure occurs in the decoder of the memory controller during the LDPC decoding procedure. Thus, the probability of causing the decoder to enter the trapping status or to oscillate between two set of error codeword bits due to the pipeline delay can be significantly reduced, and the error correction capability of the decoder can be improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller, for use in a data storage device, wherein a low-density parity-check (LDPC) decoding procedure performed by the memory controller comprises an initial phase, a decoding phase, and an output phase in sequence, the memory controller comprising:
a memory-index control circuit, configured to control data access of a variable-node memory; and
a decoder, comprising a decoding pipeline to perform the decoding phase of the LDPC decoding procedure,
wherein after the data storage device is booted up, the decoder reads a plurality of first codewords from the variable-node memory using a first order via the memory-index control circuit for LDPC decoding,
wherein in response to the decoder determining that a specific codeword among the first codewords has decoding failure, the decoder is reset to read a plurality of second codewords from the variable-node memory using a second order via the memory-index control circuit for LDPC decoding,
wherein the first order is different from the second order.

2. The memory controller as claimed in claim 1, wherein the decoder comprises a check-node circuit and a variable-node circuit, and the decoding pipeline comprises a first stage, a second stage, a third stage, and a fourth stage in sequence, and the first stage indicates that a read operation of an input codeword required by a current clock cycle performed by the variable-node circuit to read the input codeword from the variable-node memory through the memory-index control circuit, and the second stage indicates a first calculation stage of one or more input codewords performed by the variable-node circuit, and the third stage indicates a second calculation stage of the one or more input codewords performed by the check-node circuit, and the fourth stage indicates that a write operation of a syndrome calculated by the check-node circuit in the current clock cycle performed by the check-node circuit to write the syndrome to the variable-node memory.

3. The memory controller as claimed in claim 2, wherein the memory-index control circuit further provides LDPC parameters corresponding to the first order or the second order to the variable-node circuit and the check-node circuit of the decoder.

4. The memory controller as claimed in claim 2, wherein in the decoding phase, during each LDPC iterative operation:
the check-node circuit obtains a codeword difference from the variable-node circuit, and calculates the syndrome according to the codeword difference; and
the variable-node circuit performs the following steps:
determining a syndrome weight according to the syndrome from the check-node circuit;
obtaining a previous codeword generated by a previous LDPC decoding iterative operation, and obtaining a channel value that was previously read from a flash memory without accessing a channel-value memory;
determining a bit-flipping algorithm to flip one or more codeword bits in the previous codeword according to the syndrome weight to generate an updated codeword; and
subtracting the previous codeword from the updated codeword to generate the codeword difference.

5. The memory controller as claimed in claim 1, wherein the first order is an ascending order, and the second order indicates even numbers first and the odd numbers.

6. The memory controller as claimed in claim 4, wherein in the initial phase, the variable-node circuit obtains the channel value that was read from the flash memory from the channel-value memory, and transmits the channel-value to the check-node circuit to calculate the syndrome.

7. The memory controller as claimed in claim 3, wherein in the decoding phase, in response to the variable-node circuit determining that the syndrome is equal to 0 or a number of iterative operations has reached an upper limit, the variable-node circuit ends the decoding phase to enter the output phase.

8. A method for controlling data in a decoding pipeline, for use in a data storage device, wherein the data storage device comprises a memory controller and a flash memory, and a data-reading procedure of the flash memory comprises a low-density parity-check (LDPC) decoding procedure, and the memory controller comprises a memory-index control circuit and a decoder, and the LDPC decoding procedure comprises an initial phase, a decoding phase, and an output phase, the method comprising:
after the data storage device is booted up, utilizing the decoder to read a plurality of first codewords from a variable-node memory using a first order via the memory-index control circuit for LDPC decoding; and
in response to the decoder determining that a specific codeword among the first codewords has decoding failure, resetting the decoder to read a plurality of second codewords from the variable-node memory using a second order via the memory-index control circuit for LDPC decoding,
wherein the first order is different from the second order.

9. The method as claimed in claim 8, wherein the decoder comprises a check-node circuit and a variable-node circuit, and the decoding pipeline comprises a first stage, a second stage, a third stage, and a fourth stage in sequence, and the first stage indicates that a read operation of an input codeword required by a current clock cycle performed by the variable-node circuit to read the input codeword from the variable-node memory through the memory-index control circuit, and the second stage indicates a first calculation stage of one or more input codewords performed by the variable-node circuit, and the third stage indicates a second calculation stage of the one or more input codewords performed by the check-node circuit, and the fourth stage indicates that a write operation of a syndrome calculated by the check-node circuit in the current clock cycle performed by the check-node circuit to write the syndrome to the variable-node memory.

10. The method as claimed in claim 9, wherein the memory-index control circuit further provides LDPC parameters corresponding to the first order or the second order to the variable-node circuit and the check-node circuit of the decoder.

11. The method as claimed in claim 9, wherein in the decoding phase, during each LDPC iterative operation, the method further comprises:
   utilizing the check-node circuit to obtain a codeword difference from the variable-node circuit, and to calculate the syndrome according to the codeword difference; and
   utilizing the variable-node circuit to perform the following steps:
      determining a syndrome weight according to the syndrome from the check-node circuit;
      obtaining a previous codeword generated by a previous LDPC decoding iterative operation, and obtaining a channel value that was previously read from a flash memory without accessing a channel-value memory;
      determining a bit-flipping algorithm to flip one or more codeword bits in the previous codeword according to the syndrome weight to generate an updated codeword; and
      subtracting the previous codeword from the updated codeword to generate the codeword difference.

12. The method as claimed in claim 11, wherein the first order is an ascending order, and the second order indicates even numbers first and the odd numbers.

13. The method as claimed in claim 10, further comprising:
   in the initial phase, utilizing the variable-node circuit to obtain the channel value that was read from the flash memory from the channel-value memory, and to transmit the channel-value to the check-node circuit to calculate the syndrome.

14. The method as claimed in claim 10, further comprising: in the decoding phase, in response to the variable-node circuit determining that the syndrome is equal to 0 or a number of iterative operations has reached an upper limit, utilizing the variable-node circuit to end the decoding phase to enter the output phase.

* * * * *